(12) United States Patent
Lee

(10) Patent No.: US 7,006,190 B2
(45) Date of Patent: Feb. 28, 2006

(54) LIQUID CRYSTAL DISPLAY FOR HOME APPLIANCE AND PRINTED CIRCUIT BOARD THEREOF

(75) Inventor: Phal Jin Lee, Jinhae-si (KR)

(73) Assignee: LG Electronics Inc., Seoul (KR)

( * ) Notice: Subject to any disclaimer, the term of this patent is extended or adjusted under 35 U.S.C. 154(b) by 112 days.

(21) Appl. No.: 10/721,361

(22) Filed: Nov. 26, 2003

(65) Prior Publication Data

US 2004/0105045 A1    Jun. 3, 2004

(30) Foreign Application Priority Data

Nov. 29, 2002  (KR)  .................. 10-2002-0075454

(51) Int. Cl.
*G02F 1/1345*   (2006.01)
*G02F 1/1333*   (2006.01)
(52) U.S. Cl. .................. 349/149; 349/138; 349/150
(58) Field of Classification Search ......... 349/149–152
See application file for complete search history.

(56) References Cited

U.S. PATENT DOCUMENTS

| | | | | |
|---|---|---|---|---|
| 5,161,009 A | * | 11/1992 | Tanoi et al. | 349/150 |
| 5,743,748 A | * | 4/1998 | Takahata et al. | 439/71 |
| 6,094,359 A | * | 7/2000 | Avramis et al. | 361/796 |
| 6,580,620 B1 | * | 6/2003 | Kim | 361/784 |

FOREIGN PATENT DOCUMENTS

| | | | |
|---|---|---|---|
| JP | 11-121892 | * | 4/1999 |
| KR | 2002022980 | * | 3/2002 |
| KR | 2002023065 | * | 3/2002 |
| KR | 2002023066 | * | 3/2002 |

\* cited by examiner

*Primary Examiner*—Tarifur R. Chowdhury
(74) *Attorney, Agent, or Firm*—Birch, Stewart, Kolasch & Birch, LLP

(57) ABSTRACT

Disclosed is a liquid crystal display assembly for a home appliance and printed circuit board thereof, by which an accurate assembly structure is provided. The present invention includes an insulator provided rectangular at one side of the hoe appliance to have a guide along an edge of the insulator, a printed circuit board loaded inside the guide, a coating layer on the printed circuit board, an LCD panel provided over the coating layer, and a plurality of recesses formed along edges of the insulator, the printed circuit board, the coating layer, and the LCD panel.

14 Claims, 4 Drawing Sheets

LIQUID CRYSTAL DISPLAY FOR HOME APPLIANCE AND PRINTED CIRCUIT BOARD THEREOF

This application claims the benefit of Korean Application(s) No. 10-2002-0075454 filed on Nov. 29, 2002, which is/are hereby incorporated by reference.

BACKGROUND OF THE INVENTION

1. Field of the Invention

The present invention relates to a liquid crystal display assembly for a home appliance and printed circuit board thereof, by which an improved assembly structure is provided.

2. Discussion of the Related Art

Generally, a washing machine is an apparatus for performing washing by a complex mechanism including a frictional force between a water current and a laundry, a reaction of a detergent, a shock applied to the laundry by a pulsator or tub, etc.

FIG. 1 is a perspective view of a general washing machine.

Referring to FIG. 1, a control panel 3 for controlling an operation of a washing machine is provided on a top cover 1 protruding from a rear top of the washing machine. And, a controller (not shown in the drawing) handling the operation of the washing machine and a user's operational command is provided under the control panel 3.

The control panel 3 according to a related art consists of a display unit and a button unit. A plurality of buttons for selecting an operation of the washing machine are provided in the button unit, and the display unit visually displays a user's manipulation and an operational status of the washing machine. Lately, in order to display the manipulation and operational status with more excellent visual, a liquid crystal display (hereinafter abbreviated LCD) assembly is used as the display unit.

The LCD assembly consists of an LCD panel 4 formed thin and light to implement a video and a printed circuit board electrically connected to the LCD panel 4. A circuit for controlling each pixel of the LCD panel is mounted on the printed circuit board to implement the video on the LCD panel.

However, the LCD assembly is mounted on a limited space at one side of such a home appliance as a washing machine and the like. Hence, many efforts are made to development of a structure of assembling the LCD assembly to the corresponding home appliance accurately. Specifically, since the printed circuit board is provided under the LCD panel, improvement of the structure of the printed circuit board is needed to accomplish the accurate assembly of the LCD panel.

SUMMARY OF THE INVENTION

Accordingly, the present invention is directed to a liquid crystal display assembly for a home appliance and printed circuit board thereof that substantially obviates one or more of the problems due to limitations and disadvantages of the related art.

An object of the present invention, which has been devised to solve the foregoing problem, lies in providing a liquid crystal display assembly for a home appliance and printed circuit board thereof, by which an accurate assembly structure is provided.

Additional features and advantages of the invention will be set forth in the description which follows, and in part will be apparent to those having ordinary skill in the art upon examination of the following or may be learned from a practice of the invention. The objectives and other advantages of the invention will be realized and attained by the subject matter particularly pointed out in the specification and claims hereof as well as in the appended drawings.

To achieve these objects and other advantages in accordance with the present invention, as embodied and broadly described herein, there is provided an LCD assembly for a home appliance including an insulator provided rectangular at one side of the hoe appliance to have a guide along an edge of the insulator, a printed circuit board loaded inside the guide, a coating layer on the printed circuit board, an LCD panel provided over the coating layer, and a plurality of recesses formed along edges of the insulator, the printed circuit board, the coating layer, and the LCD panel.

In this case, a dummy is provided at each of the recesses to be connected to the printed circuit board through a multitude of bridges. And, the bridges extend outside the corresponding recess.

Moreover, a breaking portion of the corresponding bridges is formed relatively thin.

More specifically, a breaking portion of the corresponding bridges is formed relatively thinner than other portions by etching or stamping.

Meanwhile, the LCD assembly further includes a plurality of bosses protruding from a bottom of the insulator to penetrate the recesses, respectively.

In this case, a step is formed at an end of each of the bosses so that the LCD panel is caught on the step to leave a predetermined gap from the coating layer. And, a screw coupling hole is formed at an end of each of the bosses so that the LCD panel is coupled to the end of each of the bosses by a screw.

And, the insulator is formed of an electrically insulating material.

In another aspect of the present invention, there is provided, in an LCD assembly printed circuit board provided with a dummy connected thereto through a multitude of bridges in a recess at an edge thereof, a printed circuit board of a home appliance LCD assembly wherein the bridges extend outside the recess.

In this case, detailed elements of the printed circuit board are like those of the above-described LCD assembly for the home appliance.

It is to be understood that both the foregoing explanation and the following detailed description of the present invention are exemplary and illustrative and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT(S)

Reference will now be made in detail to the preferred embodiment(s) of the present invention, examples of which are illustrated in the accompanying drawings. Throughout the drawings, like elements are indicated using the same or similar reference designations where possible.

Figure 1:
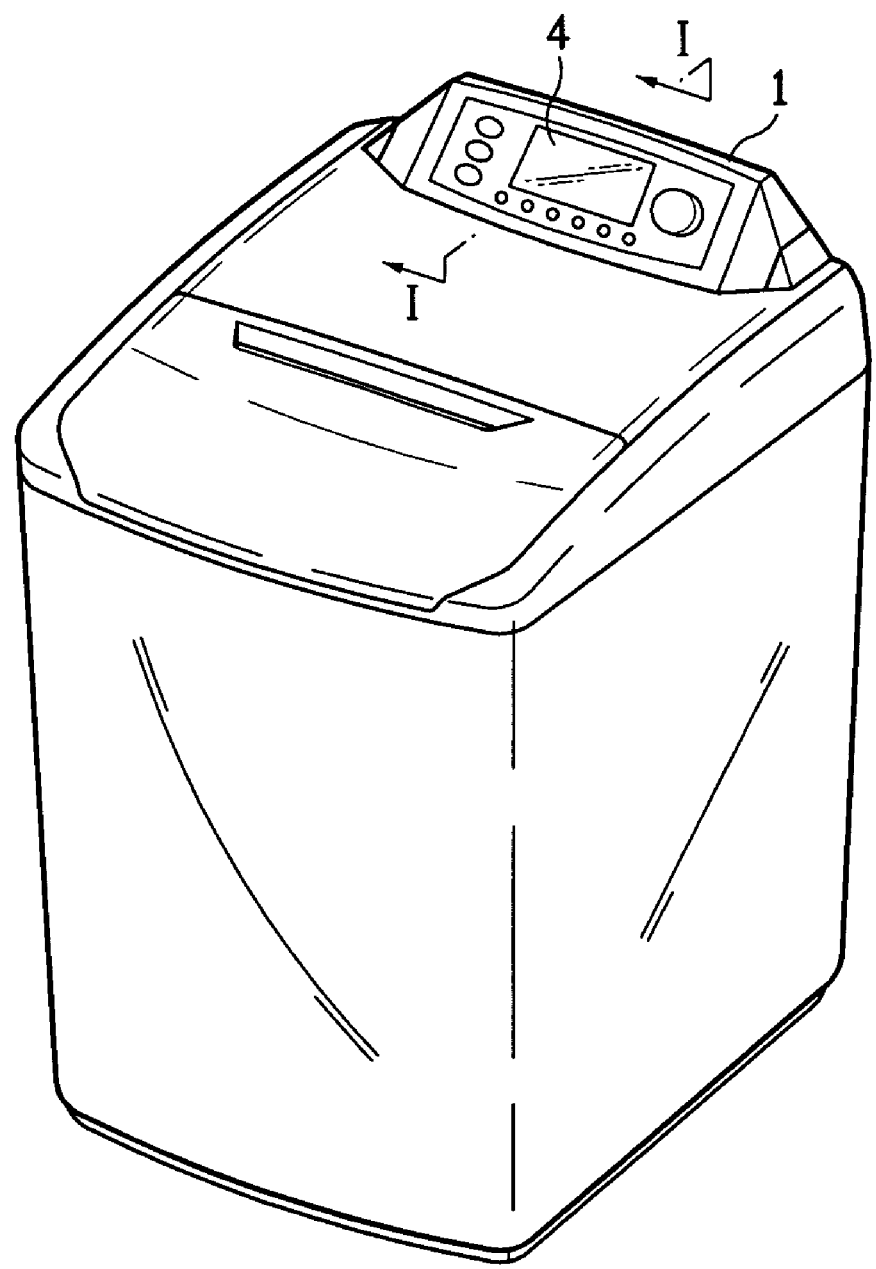
FIG. 1 is a perspective view of a general washing machine.
Figure 2:
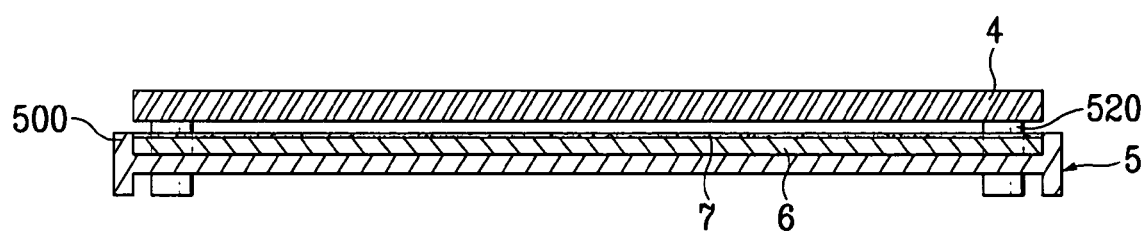
FIG. 2 is a cross-sectional view of an LCD assembly along a bisecting line I—I in FIG. 1.
Figure 3:
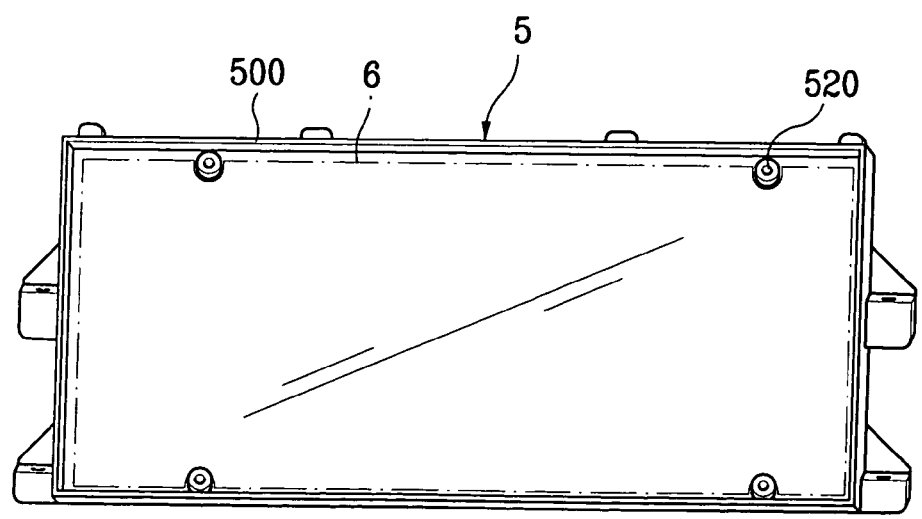
FIG. 3 is a layout of an LCD assembly.

FIG. 2 is a cross-sectional view of an LCD assembly along a bisecting line I—I in FIG. 1 and FIG. 3 is a layout of an LCD assembly.

Referring to FIG. 2, an insulator 5 is provided at a lowest part of an LCD assembly. The insulator 5 is formed of an electrically insulating material to prevent water from penetrating into a space where a controller (not shown in the drawing) is provided under the insulator 5 as well as to be provided as a holding part holding a printed circuit board 6 thereon.

A guide 500 protrudes upward along an upper edge of the insulator 5. The printed circuit board 6 is loaded inside the guide 500, and a coating layer 7 is formed on a top surface of the printed circuit board 6 for electrical insulation and waterproof. Meanwhile, an LCD panel 4 is coupled with bosses 520 to be provided over the coating layer 7 to leave a predetermined gap. And, each of the bosses 520 protrudes to penetrate into the LCD panel 4, the coating layer 7, the printed circuit board 6, and the insulator 5, in order.

Referring to FIG. 3, the LCD assembly is shaped like a rectangular plate, and the bosses 520 are formed to couple the LCD panel 4 to fix. A hole is formed at each of the bosses 520 to be coupled with a screw, and the LCD panel 4 is coupled to the bosses 520 using the screws.

A step (not shown in the drawing) is formed on an upper end of each of the bosses 520, and a bottom face of the LCD panel 4 is caught on the steps to be fixed to leave a predetermined gap from the coating layer 7.

Besides, as a first embodiment of the present invention, a recess is formed at one side of the printed circuit board 6 to avoid interruption with each of the bosses 520.

Figure 4A:
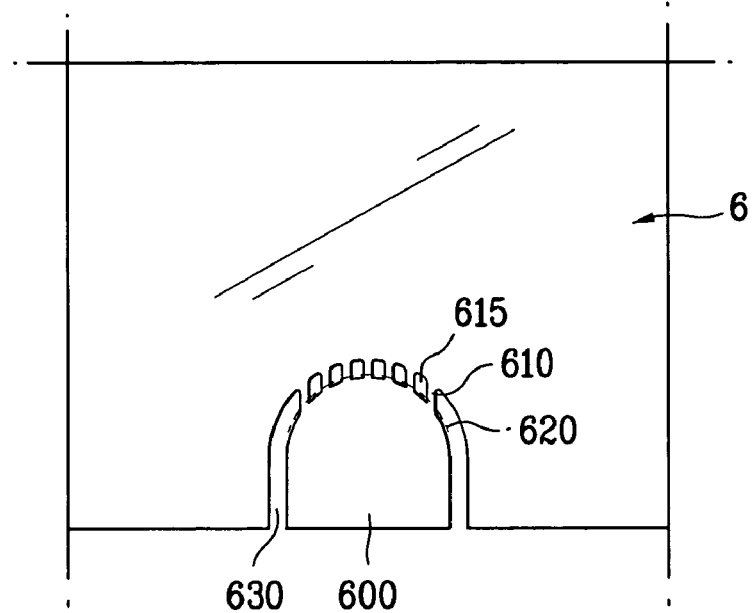
FIG. 4A and FIG. 4B are layouts of a recess on a printed circuit board according to a first embodiment of the present invention.
Figure 4B:
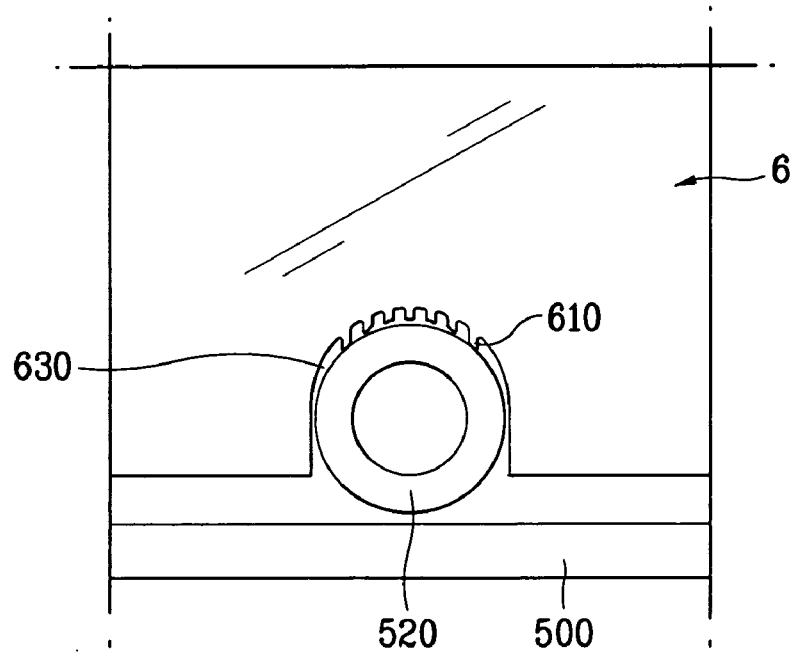

FIG. 4A is a layout of a recess on a printed circuit board according to a first embodiment of the present invention, and FIG. 4B is a layout for showing that a boss is coupled to the recess in FIG. 4A.

Referring to FIG. 4A, a recess 630 is formed at a portion of the printed circuit board 6 into which the boss 520 penetrates, and a dummy 600 is formed inside the recess 630. In this case, the dummy 600 and the printed circuit board 6 is connected to each other via a plurality of bridges 610, and a break line 620 is formed along a portion where the bridges 610 are formed. And, a multitude of perforated holes 615 are formed between the bridges 610.

When the printed circuit board 6 is loaded on the insulator 5, the dummy 600 connected to the printed circuit board 6 is removed. Namely, grabbed to be broken, the dummy 600 is cut along the break line 620 to be separated from the printed circuit board 6.

In this case, the dummy 600 plays a role in preventing lead from leaking through the recess 630 in a soldering process of the printed circuit board 6 as well.

Referring to FIG. 4B, when an area of the dummy 600 is cut to be broken, the bridges 610 sill remain to protrude inward the recess 630. The remaining bridges 610 interrupt the boss 610 so that the LCD panel 4 fails in alignment.

Namely, the remaining bridges 610 in the LCD assembly according to the first embodiment of the present invention are reciprocally interrupted with the bosses 20, whereby the alignment of the LCD panel 4 coupled to the bosses 520 deviates from a correct position.

A second embodiment of the present invention that overcomes the above problem is explained as follows.

Figure 5A:
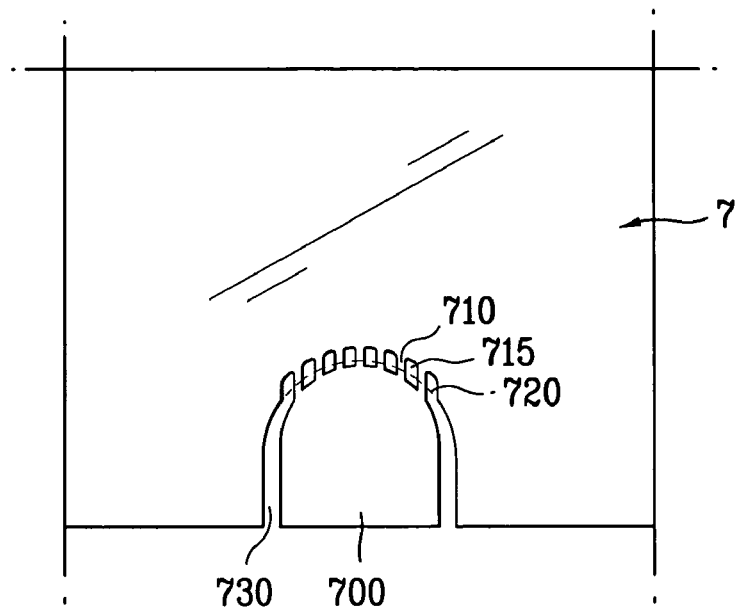
FIG. 5A and FIG. 5B are layouts of a recess on a printed circuit board according to a second embodiment of the present invention.
Figure 5B:
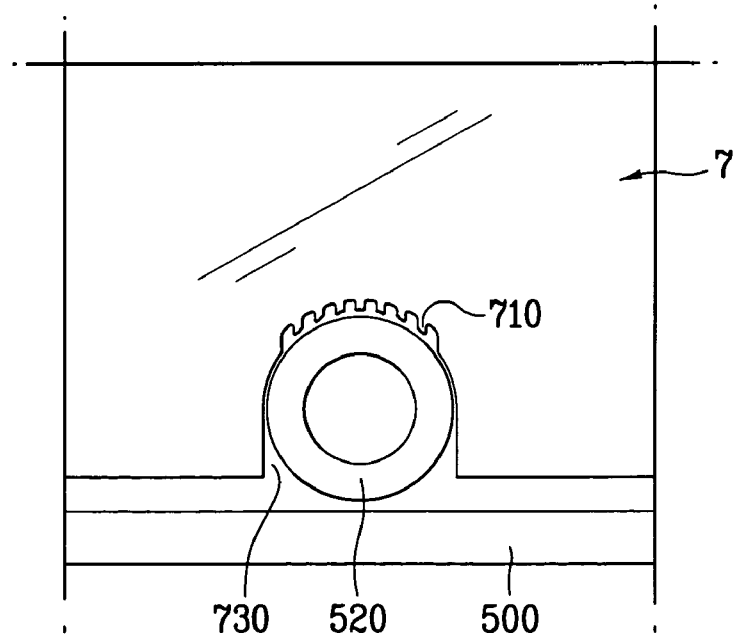

FIG. 5A is a layout of a recess on a printed circuit board according to a second embodiment of the present invention, and FIG. 5B is a layout for showing that a boss is coupled to the recess in FIG. 5A.

In a printed circuit board 7 according to a second embodiment of the present invention, a recess 730 is formed to have a shape corresponding to the boss 520, whereby the interruption between the boss 520 and bridges 710 is prevented.

THE LCD assembly includes an insulator 5, an LCD panel 4, a printed circuit board 7, and a boss 520.

A guide 500 protrudes upward along an upper edge of the insulator 5, and the printed circuit board 7 is loaded inside the guide 500. A plurality of recesses 730 into which the bosses 520 penetrate, respectively are formed at the printed circuit board 7, and a dummy 700 is formed inside each of the recesses 730.

As mentioned in description of the first embodiment of the present invention, when the printed circuit board 7 is loaded on the insulator 5, the dummy 700 at each of the recesses 730 is removed.

In the second embodiment according to the present invention, the bridges 710 connecting the dummy 700 inside the recess 730 to the printed circuit board 7 are formed to extend outside the recess 730. Namely, the bridges 710 in the second embodiment of the present invention are formed longer than those 610 in the first embodiment of the present invention so that a break line 720 of the bridges 710 is formed outside the recess 700. In this case, the break line is a reference line for cutting to break the bridges 710. Besides, a multitude of perforated holes 715 are formed between the corresponding bridges 710.

Referring to FIG. 5A, the dummy 700 in the recess 730 is cut to be broken along the break line 720.

In this case, the bridges 710 connecting the dummy 700 to the printed circuit board 7 is cut along the break line 720. Yet, the bridges 710 extending outside the recess 700 are cut so as not to remain inside the recess 700. Hence, when the printed circuit board 7 is loaded on the insulator 5, the bridges 710 and boss 520 are prevented from being interrupted with each other.

Moreover, as the bridges 710 and boss 520 are not interrupted with each other, alignment of the LCD panel 4 to be coupled with the bosses 520 can be accurately accomplished.

Meanwhile, a break portion corresponding to the break line 720 of the bridges 710 is formed thinner than other portions of the printed circuit board 7, thereby facilitating to cut to break the bridges along the break line 720 in removing the corresponding dummy 700.

Besides, the breaking portion thinner than other portions can be formed by etching or stamping.

Accordingly, the present invention has the following advantage or effect.

First of all, the LCD assembly according to the present invention improves the structure of the recess of the printed circuit board to prevent interruption between the printed circuit board 7 and the bosses 520 coupled with the LCD panel 4, whereby the LCD panel 4 and the printed circuit board 7 can be fixed to accurate locations.

It will be apparent to those skilled in the art that various modifications and variations can be made in the present invention without departing from the spirit or scope of the invention. Thus, it is intended that the present invention cover such modifications and variations, provided they come within the scope of the appended claims and their equivalents.

What is claimed is:

1. An LCD assembly for a home appliance, comprising:
   an insulator provided rectangular at one side of the home appliance to have a guide along an edge of the insulator;
   a printed circuit board loaded inside the guide;
   a coating layer on the printed circuit board;
   an LCD panel provided over the coating layer; and
   a plurality of recesses formed along edges of the insulator, the printed circuit board, the coating layer, and the LCD panel.

2. The LCD assembly as claimed in claim 1, further comprising a dummy at each of the recesses to be connected to the printed circuit board through a multitude of bridges.

3. The LCD assembly as claimed in claim 2, wherein the bridges extend outside the corresponding recess.

4. The LCD assembly as claimed in claim 2, wherein a breaking portion of the corresponding bridges is formed relatively thin.

5. The LCD assembly as claimed in claim 2, wherein a breaking portion of the corresponding bridges is formed relatively thinner than other portions by etching.

6. The LCD assembly as claimed in claim 2, wherein a breaking portion of the corresponding bridges is formed relatively thinner than other portions by stamping.

7. The LCD assembly as claimed in claim 1, further comprising a plurality of bosses protruding from a bottom of the insulator to penetrate the recesses, respectively.

8. The LCD assembly as claimed in claim 7, wherein a step is formed at an end of each of the bosses so that the LCD panel is caught on the step to leave a predetermined gap from the coating layer.

9. The LCD assembly as claimed in claim 7, wherein a screw coupling hole is formed at an end of each of the bosses so that the LCD panel is coupled to the end of each of the bosses by a screw.

10. The LCD assembly as claimed in claim 1, wherein the insulator is formed of an electrically insulating material.

11. In an LCD assembly printed circuit board provided with a dummy connected thereto through a multitude of bridges in a recess at an edge thereof, a printed circuit board of a home appliance LCD assembly wherein the bridges extend outside the recess.

12. The printed circuit board as claimed in claim 11, wherein a breaking portion of the bridges is formed relatively thin.

13. The printed circuit board as claimed in claim 11, wherein a breaking portion of the bridges is formed relatively thinner than other portions by etching.

14. The printed circuit board as claimed in claim 11, wherein a breaking portion of the bridges is formed relatively thinner than other portions by stamping.

* * * * *